(12) United States Patent
Carothers et al.

(10) Patent No.: US 10,886,164 B2
(45) Date of Patent: *Jan. 5, 2021

(54) ISOLATED SEMICONDUCTOR LAYER OVER BURIED ISOLATION LAYER

(71) Applicant: TEXAS INSTRUMENTS INCORPORATED, Dallas, TX (US)

(72) Inventors: Daniel Nelson Carothers, Lucas, TX (US); Jeffrey R. Debord, Dallas, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/831,753

(22) Filed: Dec. 5, 2017

(65) Prior Publication Data

US 2018/0096882 A1 Apr. 5, 2018

Related U.S. Application Data

(63) Continuation of application No. 15/263,425, filed on Sep. 13, 2016, now Pat. No. 9,865,498, which is a
(Continued)

(51) Int. Cl.
*H01L 21/762* (2006.01)
*H01L 21/02* (2006.01)
(Continued)

(52) U.S. Cl.
CPC .... *H01L 21/76278* (2013.01); *H01L 21/0223* (2013.01); *H01L 21/02164* (2013.01); *H01L 21/02532* (2013.01); *H01L 21/02645* (2013.01); *H01L 21/02667* (2013.01); *H01L 21/02675* (2013.01); *H01L 21/02686* (2013.01);
(Continued)

(58) Field of Classification Search
CPC ......... H01L 21/76278; H01L 21/76205; H01L 21/7621; H01L 21/76294; H01L 21/76248; H01L 21/76262; H01L 21/76272; H01L 21/76286; H01L 21/02645;
(Continued)

(56) References Cited

U.S. PATENT DOCUMENTS 4,494,303 A * 1/1985 Celler ............... H01L 21/76297
117/54
4,615,746 A * 10/1986 Kawakita ............... H01L 21/22
257/506
(Continued)

*Primary Examiner* — Michael M Trinh
(74) *Attorney, Agent, or Firm* — Andrew R. Ralston; Charles A. Brill; Frank D. Cimino

(57) ABSTRACT

An integrated circuit may be formed by forming an isolation recess in a single-crystal silicon-based substrate. Sidewall insulators are formed on sidewalls of the isolation recess. Thermal oxide is formed at a bottom surface of the isolation recess to provide a buried isolation layer, which does not extend up the sidewall insulators. A single-crystal silicon-based semiconductor layer is formed over the buried isolation layer and planarized to be substantially coplanar with the substrate adjacent to the isolation recess, thus forming an isolated semiconductor layer over the buried isolation layer. The isolated semiconductor layer is laterally separated from the substrate.

20 Claims, 7 Drawing Sheets

Related U.S. Application Data continuation of application No. 14/301,848, filed on Jun. 11, 2014, now Pat. No. 9,472,571.

(60) Provisional application No. 61/978,937, filed on Apr. 13, 2014.

(51) Int. Cl.
  *H01L 27/12* (2006.01)
  *H01L 21/84* (2006.01)
  *H01L 21/306* (2006.01)

(52) U.S. Cl.
  CPC .. *H01L 21/30625* (2013.01); *H01L 21/76205* (2013.01); *H01L 21/76224* (2013.01); *H01L 21/76272* (2013.01); *H01L 21/76281* (2013.01); *H01L 21/84* (2013.01); *H01L 27/1203* (2013.01); *H01L 21/0262* (2013.01); *H01L 21/02255* (2013.01); *H01L 21/02636* (2013.01)

(58) Field of Classification Search
  CPC ......... H01L 21/02636; H01L 21/02667; H01L 21/02675
  See application file for complete search history.

(56) References Cited

U.S. PATENT DOCUMENTS

| | | | | |
|---|---|---|---|---|
| 4,814,287 | A | * | 3/1989 | Takemoto ............. H01L 21/743 257/E21.538 |
| 5,087,586 | A | * | 2/1992 | Chan .................. H01L 21/76229 257/E21.547 |
| 5,801,083 | A | * | 9/1998 | Yu ...................... H01L 21/76232 148/DIG. 161 |
| 6,306,723 | B1 | * | 10/2001 | Chen ................. H01L 21/76229 257/E21.548 |
| 6,551,937 | B2 | * | 4/2003 | Jun .................... H01L 21/76208 257/E21.554 |
| 6,555,891 | B1 | | 4/2003 | Furukawa et al. |
| 7,001,804 | B2 | * | 2/2006 | Dietz ................. H01L 21/76264 257/E21.564 |
| 7,338,848 | B1 | | 3/2008 | Kempf |
| 7,432,173 | B2 | * | 10/2008 | Kang ................. H01L 21/2026 438/430 |
| 9,472,571 | B2 | * | 10/2016 | Carothers ........... H01L 27/1203 |
| 9,865,498 | B2 | * | 1/2018 | Carothers ........... H01L 27/1203 |
| 2002/0190344 | A1 | * | 12/2002 | Michejda ........... H01L 29/0653 257/510 |

* cited by examiner

ISOLATED SEMICONDUCTOR LAYER OVER BURIED ISOLATION LAYER

CROSS-REFERENCE TO RELATED APPLICATIONS

This application is a continuation of and claims priority to U.S. patent application Ser. No. 15/263,425, filed on Sep. 13, 2016, which is a continuation of and claims priority to U.S. patent application Ser. No. 14/301,848, filed Jun. 11, 2014, which claims the benefit of priority under 35 U.S.C. § 119(e) of U.S. Provisional Patent Application No. 61/978,937, filed Apr. 13, 2014, all of which are hereby incorporated by reference in their entireties.

TECHNICAL FIELD

This invention relates to the field of integrated circuits. More particularly, this invention relates to isolated semiconductor layers over buried isolation layers in integrated circuits.

BACKGROUND

An integrated circuit with some circuits or components in dielectrically isolated silicon may be formed on a silicon-on-insulator (SOI) wafer. SOI wafers are more expensive than bulk and epitaxial wafers, undesirably increasing the cost of the integrated circuit. Alternately, the circuits or components may be formed over buried layers of silicon dioxide; methods to form the buried silicon dioxide layers such as implanting oxygen have been problematic with respect to providing desired lateral and vertical dimension control of the buried oxide layer, and undesirably increase stress on the wafer, leading to problems during photolithographic operations.

SUMMARY

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to a more detailed description that is presented later.

An integrated circuit may be formed by forming an isolation recess in a single-crystal silicon-based substrate. Sidewall insulators are formed on sidewalls of the isolation recess. Thermal oxide is formed at a bottom surface of the isolation recess to provide a buried isolation layer, which does not extend up the sidewall insulators. A single-crystal silicon-based semiconductor layer is formed over the buried isolation layer and planarized to be substantially coplanar with the substrate adjacent to the isolation recess, thus forming an isolated semiconductor layer over the buried isolation layer. The isolated semiconductor layer is laterally separated from the substrate.

DETAILED DESCRIPTION OF EXAMPLE EMBODIMENTS

The present invention is described with reference to the attached figures. The figures are not drawn to scale and they are provided merely to illustrate the invention. Several aspects of the invention are described below with reference to example applications for illustration. It should be understood that numerous specific details, relationships, and methods are set forth to provide an understanding of the invention. One skilled in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

The following co-pending patent applications are related and hereby incorporated by reference in their entirety: U.S. patent application Ser. No. 14/301,765; U.S. patent application Ser. No. 14/301,788; and U.S. patent application Ser. No. 14/301,827. With their mention in this section, these patent applications are not admitted to be prior art with respect to the present invention.

An integrated circuit may be formed by forming an isolation recess in a single-crystal silicon-based substrate. Sidewall insulators which are at least partially impermeable to oxygen are formed on sidewalls of the isolation recess. Thermal oxide is formed at a bottom surface of the isolation recess to provide a buried isolation layer, which does not extend up the sidewall insulators. The sidewall insulators prevent any significant formation of the thermal oxide at interior sidewalls of the isolation recess. A single-crystal silicon-based semiconductor layer is formed over the buried isolation layer and planarized to be substantially coplanar with the substrate adjacent to the isolation recess, thus forming an isolated semiconductor layer over the buried isolation layer. The isolated semiconductor layer is laterally separated from the substrate. The sidewall insulators may optionally be removed and replaced with another dielectric material.

Figure 1A:
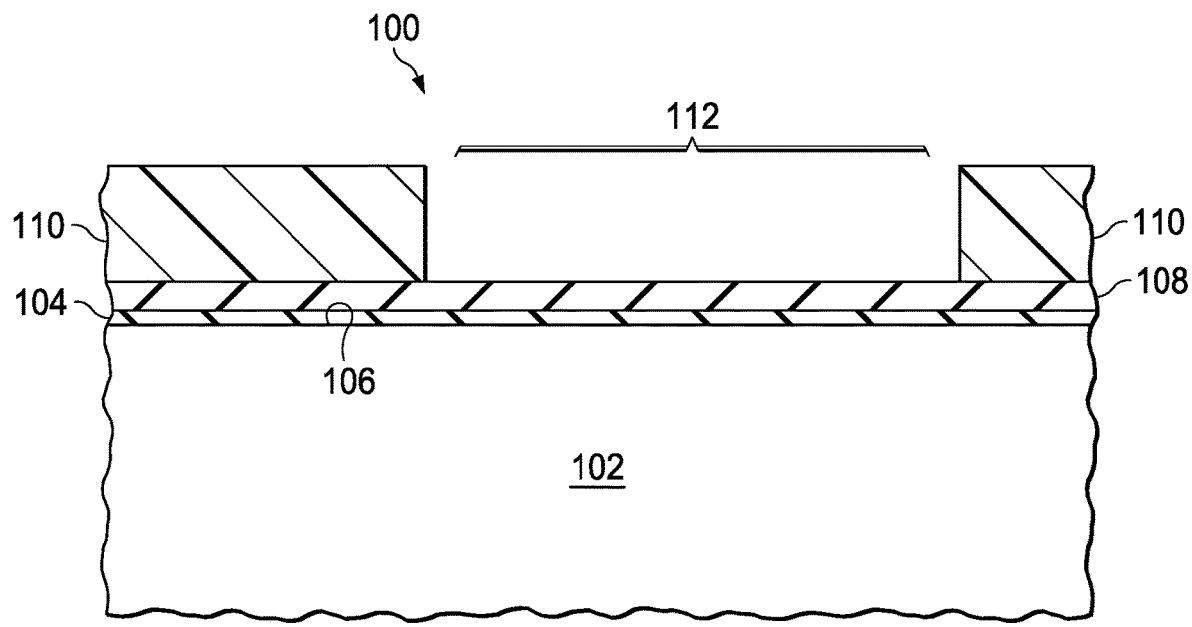
FIG. 1A through FIG. 1O are cross sections of an example integrated circuit containing an isolated semiconductor layer, depicted in successive stages of fabrication.
Figure 1B:
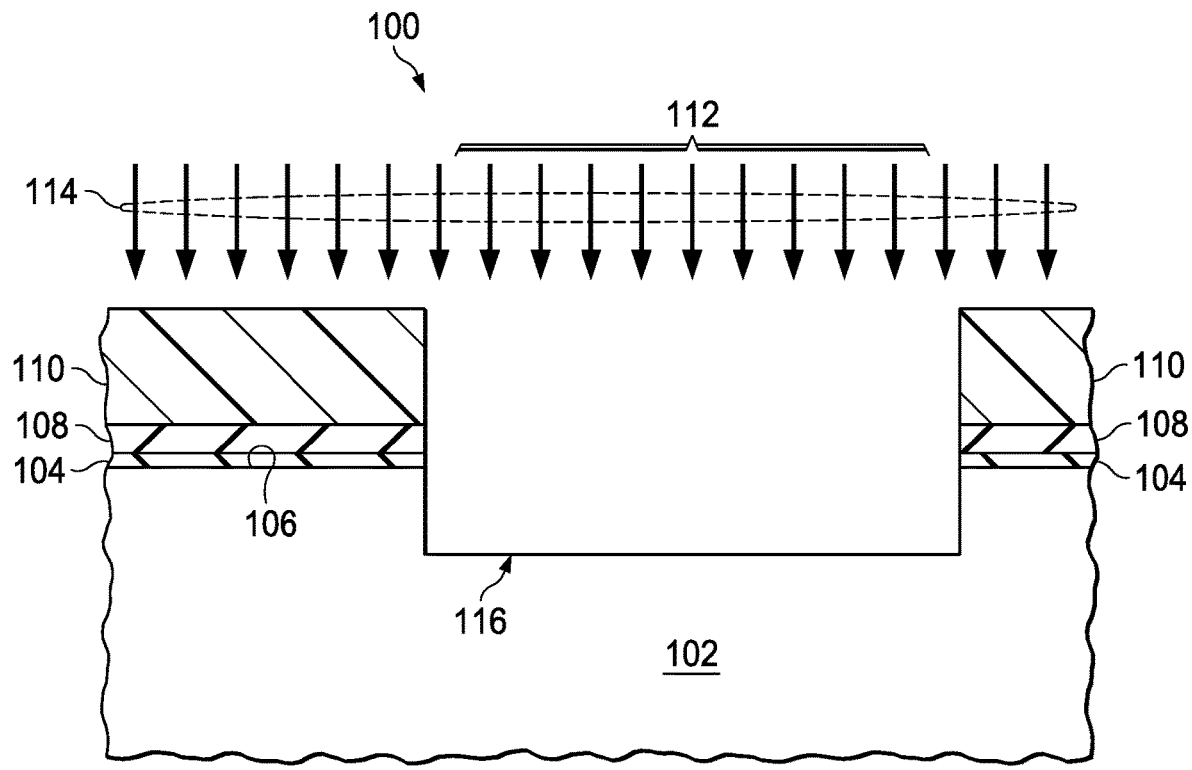
Figure 1C:
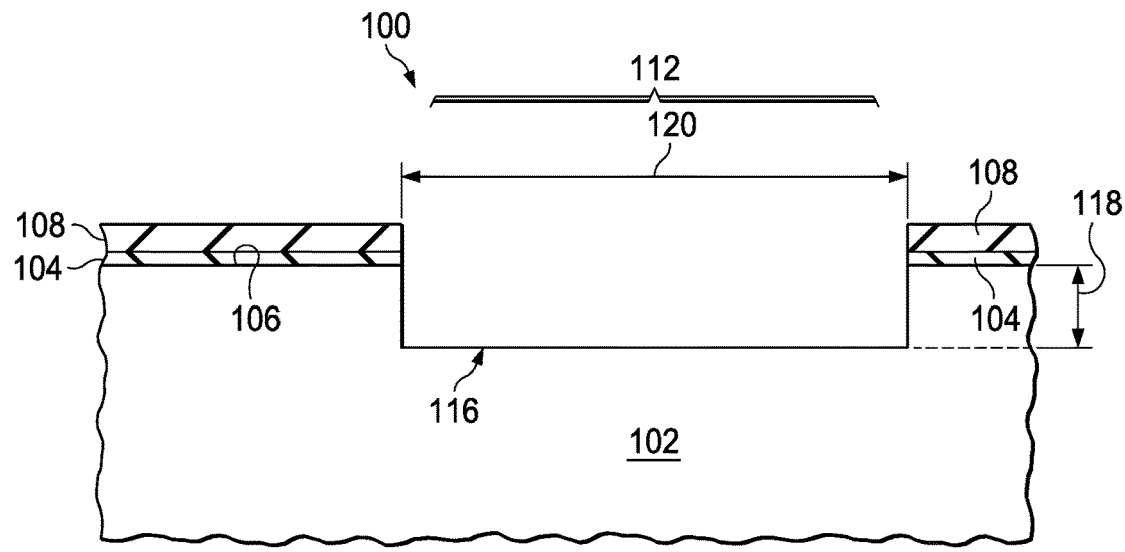
Figure 1D:
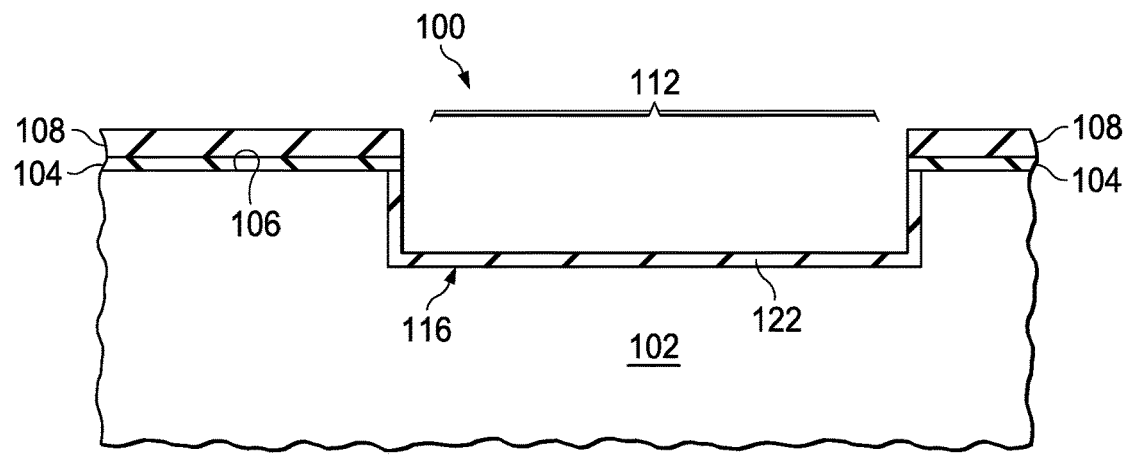
Figure 1E:
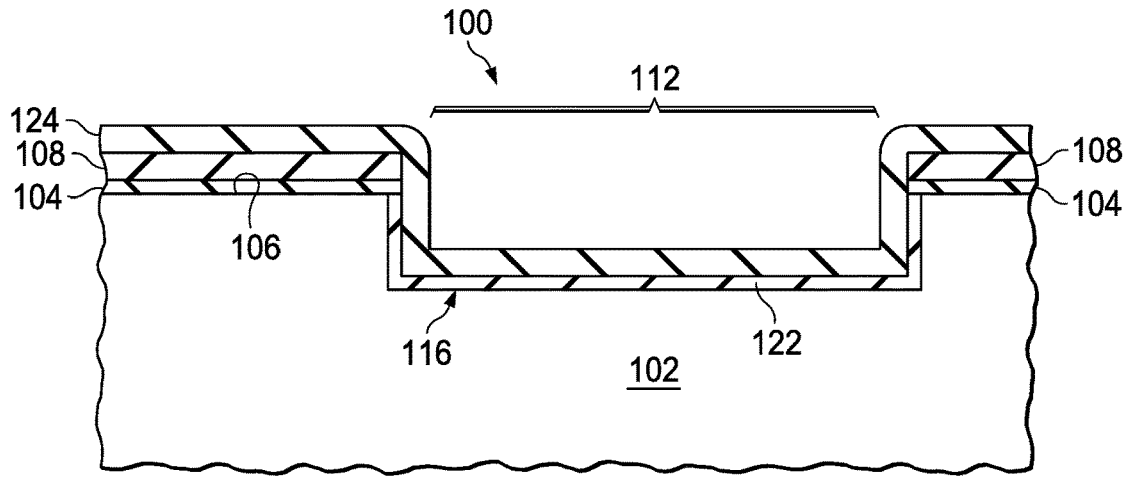
Figure 1F:
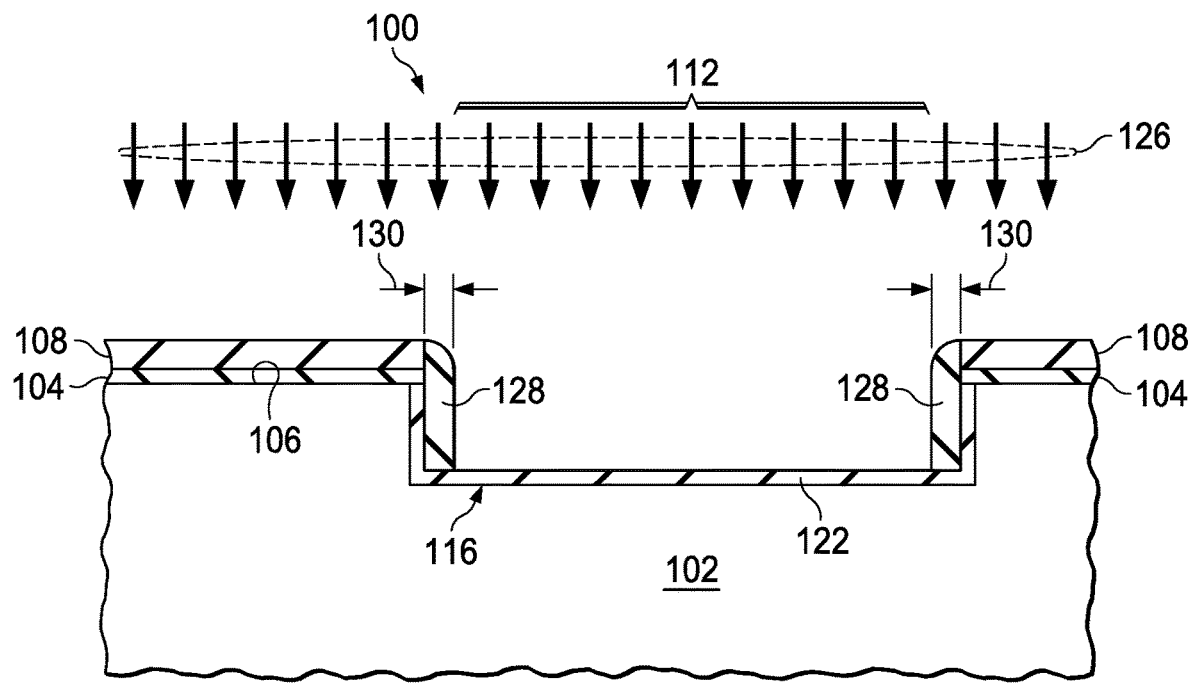
Figure 1G:
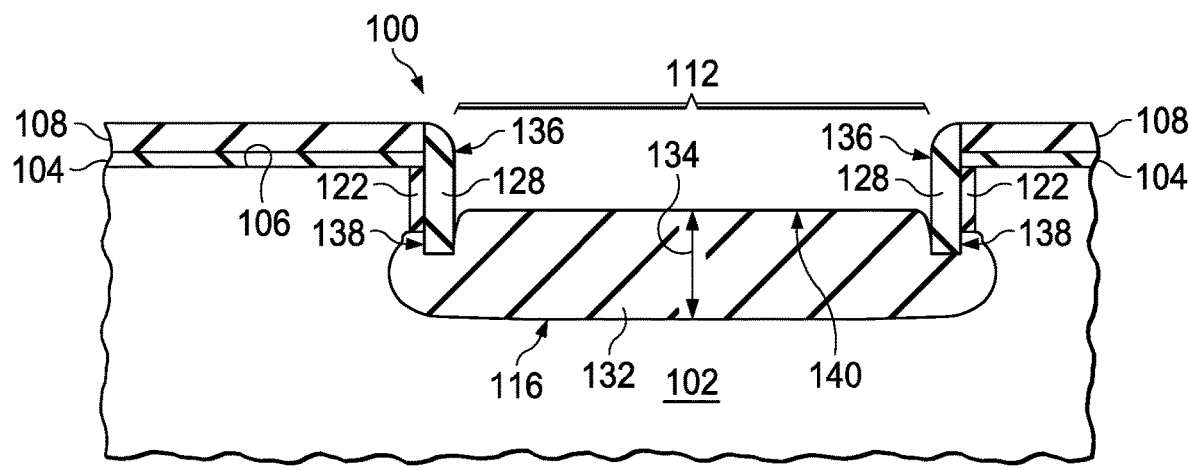
Figure 1H:
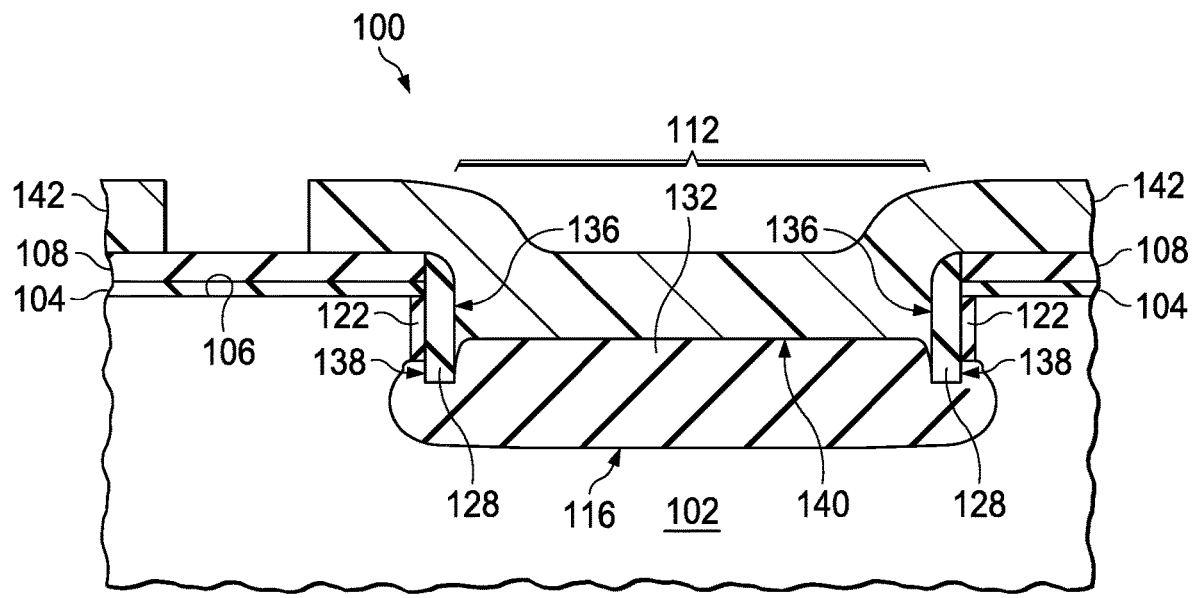
Figure 1I:
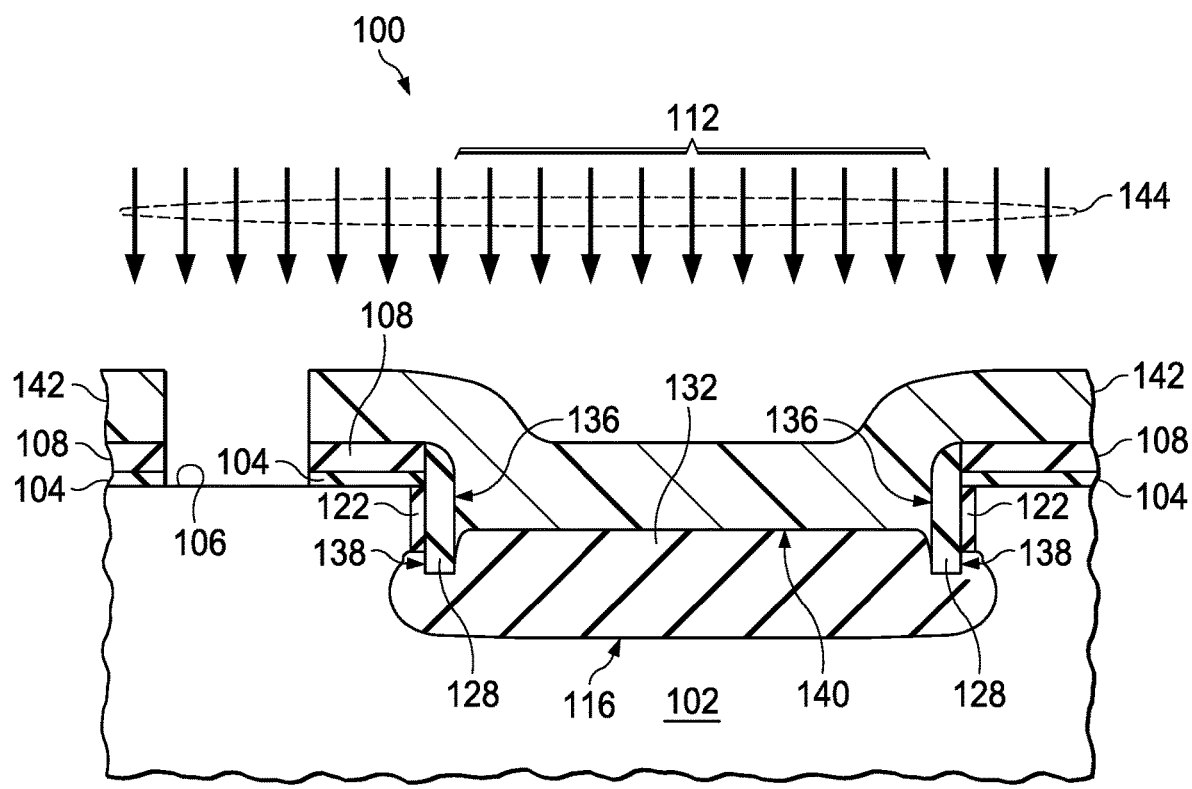
Figure 1J:
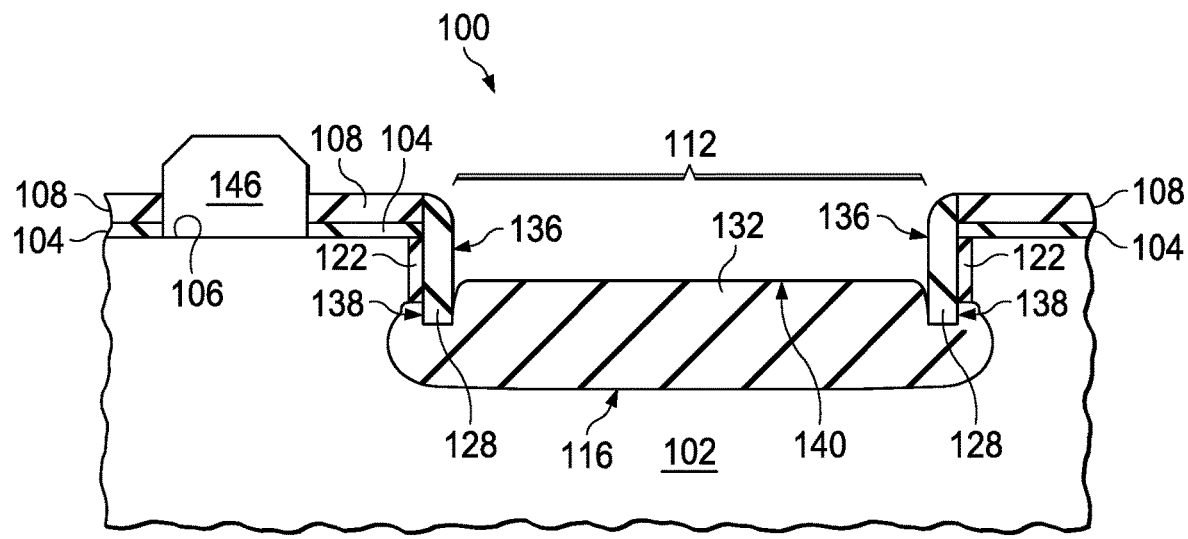
Figure 1K:
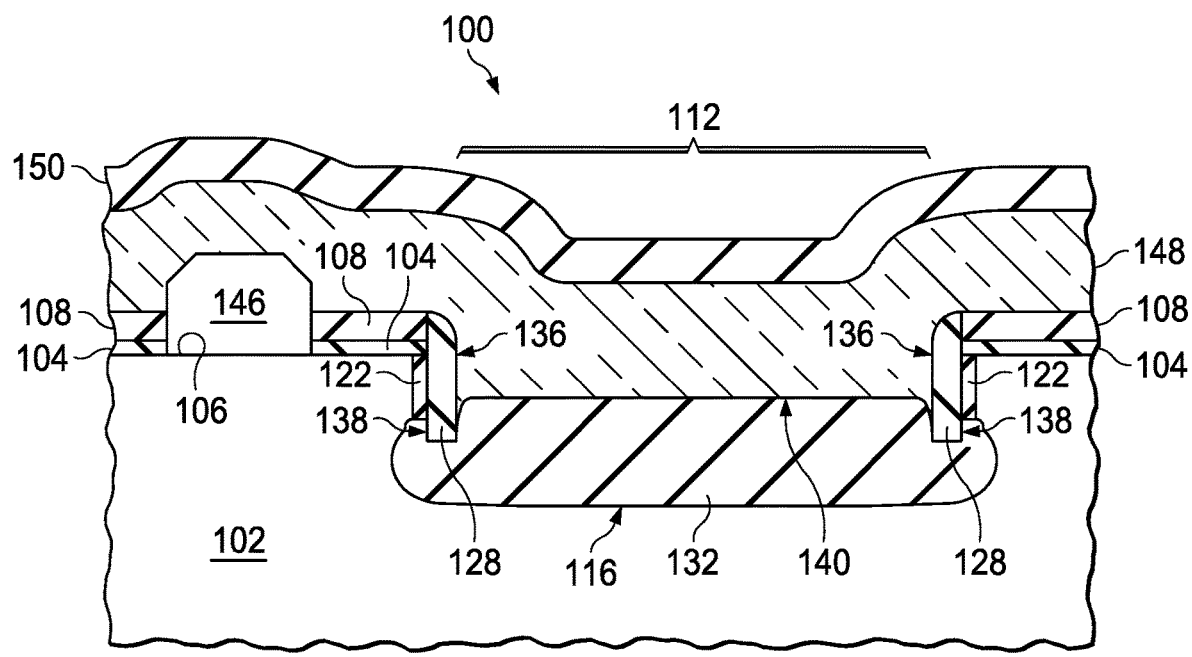
Figure 1L:
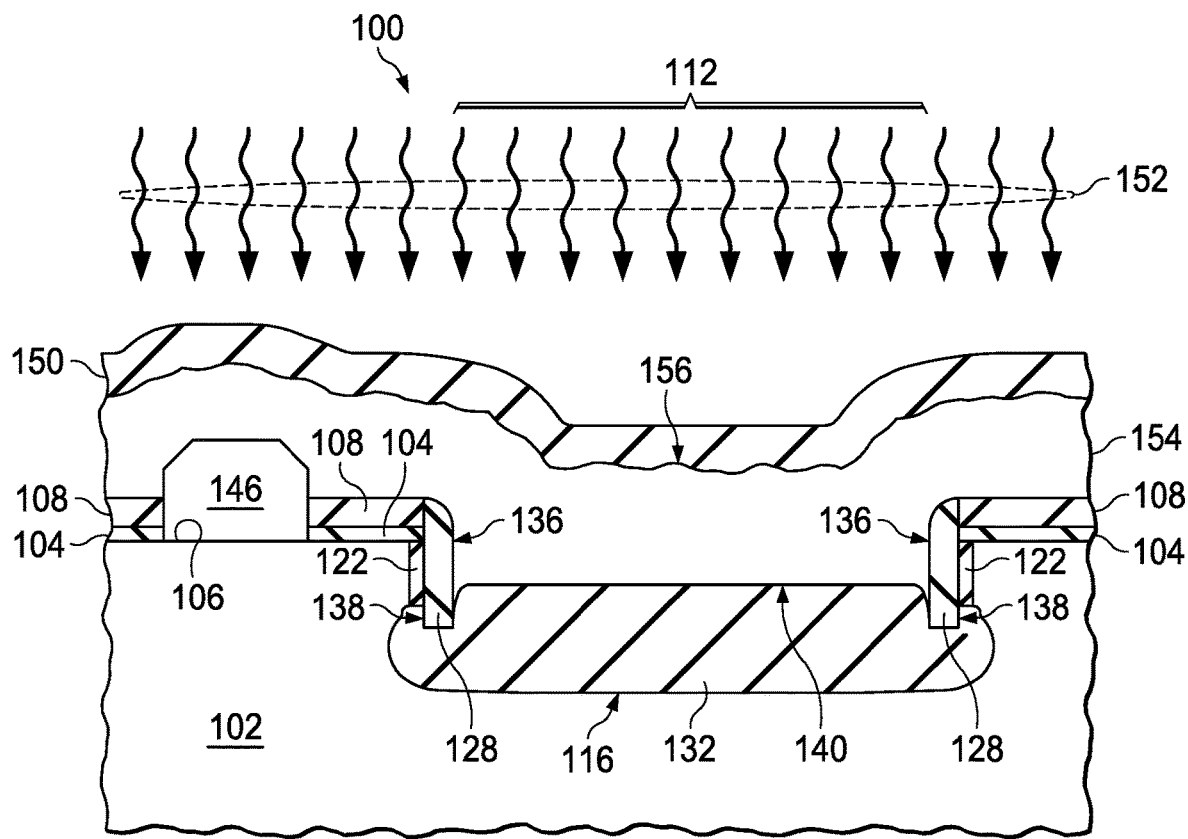
Figure 1M:
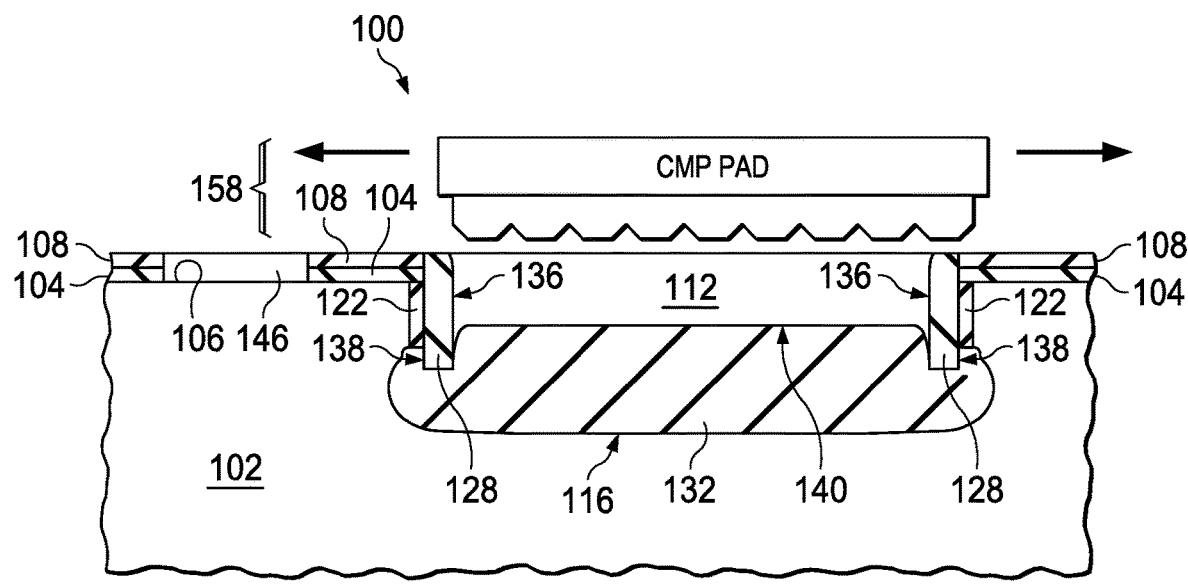
Figure 1N:
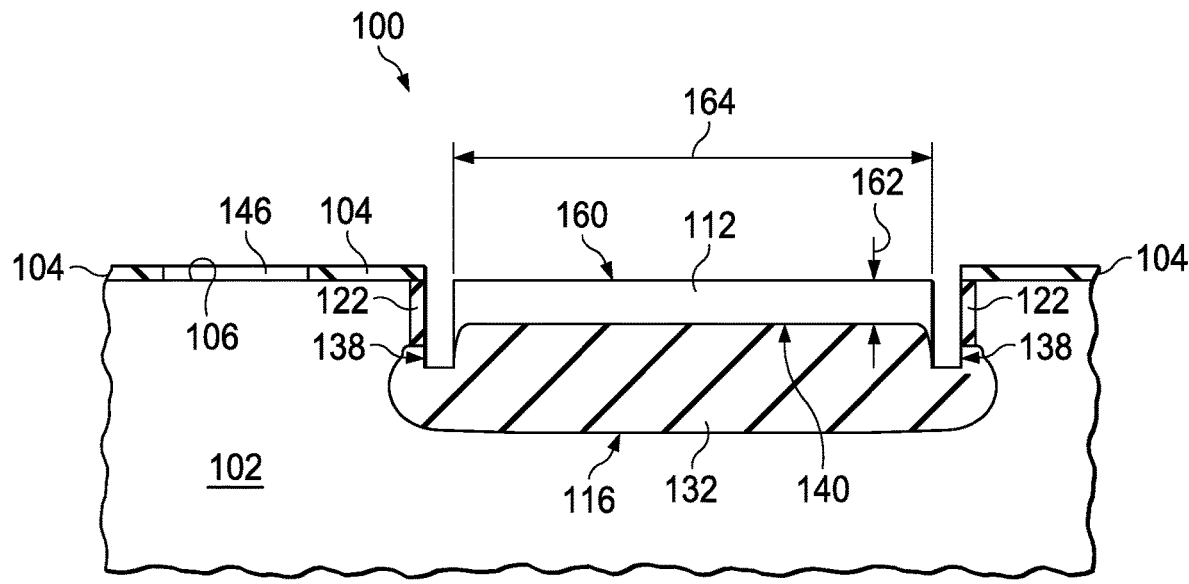
Figure 1O:
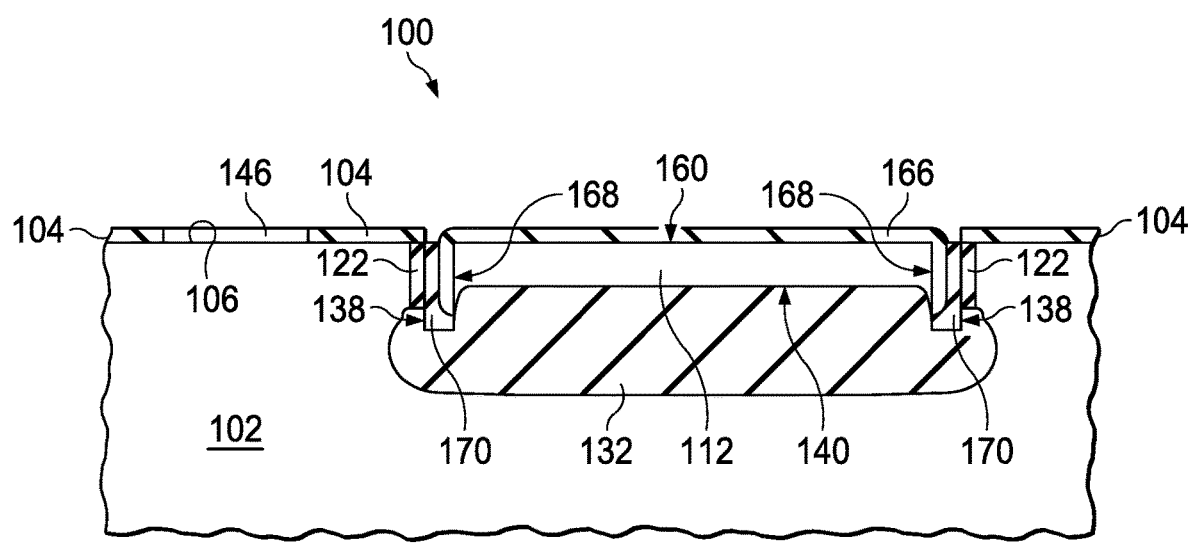

FIG. 1A through FIG. 1O are cross sections of an example integrated circuit containing an isolated semiconductor layer, depicted in successive stages of fabrication. Referring to FIG. 1A, the integrated circuit 100 is formed on a substrate 102 which includes a single-crystal silicon-based semiconductor material. A pad layer 104 of silicon dioxide is formed over a top surface 106 of the substrate 102. The pad layer 104 may be 5 nanometers to 20 nanometers thick, and may be formed by thermal oxidation. A stop layer 108 of a mechanically hard material such as silicon nitride or silicon carbide is formed over the pad layer 104. The stop layer 108 may be 50 nanometers to 150 nanometers thick, and may be formed by a low pressure chemical vapor deposition (LPCVD) process or a plasma enhanced chemical vapor deposition (PECVD) process. An isolation mask 110 is formed over the stop layer 108 so as to expose an area for an isolated semiconductor layer 112 and cover the adjacent stop layer 108. The area for the isolated semiconductor layer 112 may be, for example, 2 microns to 200 microns wide. The isolation mask 110 may include photoresist formed by a photolithographic process, and may include an anti-reflection layer and or hard mask material such as amorphous carbon.

Referring to FIG. 1B, an isolation etch process 114 removes the stop layer 108 and the pad layer 104 from the area for the isolated semiconductor layer 112 and then removes semiconductor material from the substrate 102 to form an isolation recess 116. The isolation recess 116 may be, for example, 200 nanometers to 700 nanometers deep in the substrate 102. The isolation etch process 114 may be a reactive ion etch (RIE) process, as depicted schematically in FIG. 1B. The isolation etch process 114 may be a timed etch to provide a desired depth of the isolation recess 116. The isolation mask 110 is removed; a portion of the isolation mask 110 may be removed during the isolation etch process 114 and a remaining portion may be removed after the isolation etch process 114 is completed, for example by an ash process followed by a wet clean process.

FIG. 1C depicts the integrated circuit 100 after the isolation etch process 114 is completed and the isolation mask 110 of FIG. 1B is removed. A depth 118 of the isolation recess 116 in the substrate 102 may be, for example, 200 nanometers to 700 nanometers. A width 120 of the isolation recess 116 may be, for example, 2 microns to 200 microns.

Referring to FIG. 1D, a layer of thermal oxide 122 is formed at sides and a bottom of the isolation recess 116. The layer of thermal oxide 122 may be 3 nanometers to 10 nanometers thick. The layer of thermal oxide 122 may advantageously passivate lateral surfaces of the substrate 102 at the isolation recess 116. The layer of thermal oxide 122 is sufficiently thin so that any extension of the layer of thermal oxide 122 under the stop layer 108 is less than 10 nanometers.

Referring to FIG. 1E, a layer of sidewall material 124 is conformally formed over the stop layer 108 and extending into the isolation recess 116, covering the layer of thermal oxide 122. The layer of sidewall material 124 may be 20 nanometers to 40 nanometers thick and may include silicon nitride formed by thermal decomposition of bis (tertiary-butylamino) silane (BTBAS).

Referring to FIG. 1F, an anisotropic etch process 126 removes the layer of sidewall material 124 of FIG. 1E from over the stop layer 108 and from the layer of thermal oxide 122 at the bottom of the isolation recess 116 to leave sidewall insulators 128 on the layer of thermal oxide 122 at sides of the isolation recess 116. The anisotropic etch process 126 may be an RIE process, similar to the RIE process used to form gate sidewall spacers in metal oxide semiconductor (MOS) transistor fabrication. A thickness 130 of the sidewall insulators 128 may be 15 nanometers to 30 nanometers thick.

Referring to FIG. 1G, a buried isolation layer 132 at least 100 nanometers thick is formed at the bottom of the isolation recess 116 by a thermal oxidation process. The thermal oxidation process may be a dry oxygen process using substantially no water vapor, which advantageously does not require a subsequent anneal process. Alternatively, the thermal oxidation process may be a steam oxidation process which advantageously provides a higher growth rate of the buried isolation layer 132, but may require a subsequent anneal process. In one version of the instant example, a thickness 134 of the buried isolation layer 132 may be 150 nanometers to 300 nanometers. The buried isolation layer 132 does not extend up along interior lateral surfaces 136 of the sidewall insulators 128. The buried isolation layer 132 extends under the sidewall insulators 128 and partway up exterior lateral surfaces 138 of the sidewall insulators 128. No planarization process is required on the buried isolation layer 132 to provide a top surface 140 which is suitable for forming the isolated semiconductor layer 112. The buried isolation layer 132 is lower at edges of the isolation recess 116 than at a center of the buried isolation layer 132. The top surface 140 of the buried isolation layer 132 is lower than the top surface 106 of the substrate 102 adjacent to the isolation recess 116.

The isolated semiconductor layer 112 may be formed by any of various methods. FIG. 1H through FIG. 1O depict an example process sequence. Other methods of forming the isolated semiconductor layer 112 on the buried isolation layer 132 are within the scope of the instant invention. Referring to FIG. 1H, a seed mask 142 is formed over the stop layer 108 and extending into the isolation cavity 116, so as to expose the stop layer 108 in an area for a seed layer proximate to the isolation recess 116. The seed mask 142 may include photoresist, and may further include an anti-reflection layer and/or a hard mask layer.

Referring to FIG. 1I, an etch process 144 removes the stop layer 108 and the pad layer 104 in the area for the seed layer exposed by the seed mask 142. The etch process 144 may be a plasma etch process as depicted in FIG. 1I which may advantageously enable desired dimensional control of the area for the seed layer. Alternatively, the etch process 144 may be a plasma etch process to remove the stop layer 108 combined with a wet etch process such as an aqueous buffered solution of dilute hydrofluoric acid to remove the pad layer 104, which may advantageously reduce damage to the top surface 106 of the substrate 102. Any remaining portion of the seed mask 142 is removed after the etch process 144 is completed, for example by a wet etch process suing an aqueous mixture of sulfuric acid and hydrogen peroxide followed by a wet clean process using an aqueous mixture of ammonium hydroxide and hydrogen peroxide.

Referring to FIG. 1J, a seed layer 146 of single-crystal silicon-based semiconductor material is formed on the top surface 106 of the substrate 102 in the area in which the stop layer 108 and the pad layer 104 were removed by the etch process 144 of FIG. 1I, extending above the stop layer 108. The seed layer 146 is formed by a selective epitaxy process. The selective epitaxial process may start with an in situ clean process such as the Applied Materials Siconi™ clean process, to remove any native oxide from the surface of the substrate 102. The selective epitaxial process may provide dichlorosilane ($SiH_2Cl_2$) gas at 100 standard cubic centimeters per minute (sccm) to 300 sccm and hydrogen chloride (HCl) gas at 100 sccm to 300 sccm at a pressure of 10 torr to 100 torr with the substrate 102 at a temperature of 700° C. to 900° C., which may provide a growth rate of 5 nanometers per minute to 50 nanometers per minute.

Referring to FIG. 1K, a layer of polycrystalline silicon 148, referred to as polysilicon, is formed over an existing top surface of the integrated circuit 100, laterally abutting the seed layer 146 and covering the buried isolation layer 132. The layer of polysilicon 148 fills the isolation recess 116 above the top surface 106 of the substrate 102. The layer of polysilicon 148 may be formed by thermal decomposition of silane gas at a temperature of 550° C. to 650° C. and a pressure of 200 millitorr to 450 millitorr. A cap layer 150 of dielectric material is formed over the layer of polysilicon 148. The cap layer 150 may include silicon dioxide formed by a PECVD process using tetraethyl orthosilicate, also known as tetraethoxysilane (TEOS), and/or silicon nitride formed by a PECVD process using BTBAS. The cap layer 150 may have an optical thickness, that is the thickness times an effective index of refraction, which provides an effective anti-reflection layer with respect to the layer of polysilicon 148 for a subsequent radiant-induced recrystallization process. For example, the optical thickness of the cap layer 150 may be 20 percent to 30 percent of a primary wavelength of radiant energy of the subsequent radiant-induced recrystallization process to provide an effective anti-reflection layer. For a radiant-induced recrystallization process using a flashlamp with a primary wavelength in the visible range, the optical thickness of the cap layer 150 may be 100 nanometers to 150 nanometers to provide an effective anti-reflection layer.

Referring to FIG. 1L, a radiant-induced recrystallization process 152 heats the layer of polysilicon 148 of FIG. 1K so as to crystallize the polysilicon 148 to form a single-crystal semiconductor layer 154 over the buried isolation layer 132 aligned with the seed layer 146. FIG. 1L depicts the radiant-induced recrystallization process 152 at completion. The radiant-induced recrystallization process 152 may raise the temperature of the layer of polysilicon 148 above its melting point. Forming the cap layer 150 to provide an anti-reflection layer with respect to the layer of polysilicon 148 may advantageously couple more radiant energy from the radiant-induced recrystallization process 152 into the layer of polysilicon 148, thereby promoting low defects in the single-crystal semiconductor layer 154. The radiant-induced recrystallization process 152 may produce a roughened interface 156 between the cap layer 150 and the newly crystallized single-crystal semiconductor layer 154 over the buried isolation layer 132. The radiant-induced recrystallization process 152 may include, for example, a flash lamp anneal process, as depicted schematically in FIG. 1L. Alternatively, the radiant-induced recrystallization process 152 may be a scanned laser anneal process 152 or other radiant process which provides energy to the layer of polysilicon 148 from a radiant source in any part of the electromagnetic spectrum. Forming the seed layer 146 extending above the stop layer 108 so that the layer of polysilicon 148 laterally abuts the seed layer 146 may enable the newly crystallized single-crystal semiconductor layer 154 over the buried isolation layer 132 to advantageously form with fewer defects.

Referring to FIG. 1M, the single-crystal semiconductor layer 154 of FIG. 1L is planarized down to the stop layer 108, leaving the portion of the single-crystal semiconductor layer 154 in the isolation recess 116 to provide the isolated semiconductor layer 112. The single-crystal semiconductor layer 154 may be planarized, for example, by a chemical mechanical polish (CMP) process 158, as depicted schematically in FIG. 1M. The isolated semiconductor layer 112 is separated from the substrate 102 by a combination of the sidewall insulators 128 and the buried isolation layer 132. The cap layer 150 of FIG. 1L may be removed before the single-crystal semiconductor layer 154 is planarized.

Referring to FIG. 1N, the stop layer 108 and the sidewall insulators 128 of FIG. 1M may be removed, for example by a plasma etch which is selective to the pad layer 104 and the isolated semiconductor layer 112. A top surface 160 of the isolated semiconductor layer 112 may be recessed so as to be substantially coplanar with the top surface 106 of the substrate 102 adjacent to the isolation recess 116. The top surface 160 may be recessed by a timed etch process using an aqueous buffered solution of dilute hydrofluoric acid. The top surface 160 may be recessed before removing the stop layer 108 and the sidewall insulators 128. A thickness 162 of the isolated semiconductor layer 112 may advantageously be uniform across a central portion of the isolation recess 116 due to forming the buried isolation layer 132 by thermal oxidation. The thickness 162 may be 75 nanometers to 100 nanometers. A width 164 of the isolated semiconductor layer 112 may be 2 microns to 200 microns.

Referring to FIG. 1O, a layer of thermal oxide 166 may be formed on exposed surfaces of the isolated semiconductor layer 112, including lateral surfaces 168 above the buried isolation layer 132, which may advantageously passivate the surfaces and thus improve performance of subsequently-formed devices in the isolated semiconductor layer 112. The layer of thermal oxide 166 may be 5 nanometers to 20 nanometers thick. A filler dielectric 170 may be formed between the isolated semiconductor layer 112 and the substrate 102 in space left by removal of the sidewall insulators 128 of FIG. 1M. The filler dielectric 170 may be primarily silicon dioxide, formed using an ozone based thermal chemical vapor deposition (CVD) process, also known as a high aspect ratio process (HARP), or using methylsilsesquioxane (MSQ). Forming the filler dielectric 170 may advantageously facilitate subsequent planar processing of the integrated circuit 100.

While various embodiments of the present invention have been described above, it should be understood that they have been presented by way of example only and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

What is claimed is:

1. A method of forming an integrated circuit, comprising:
   forming an isolation recess in a substrate comprising a semiconductor material;
   exposing a single-crystal portion of the semiconductor material;
   forming a sidewall insulator at a sidewall of the isolation recess;
   forming a buried isolation layer of thermal oxide at a bottom of the isolation recess using a thermal oxidation process so that the buried isolation layer extends under the sidewall insulator and up along at least a portion of an exterior lateral surface of the sidewall insulator, wherein a top surface of the buried isolation layer is lower than a top surface of the substrate;
   forming a polycrystalline layer of a semiconductor material that covers the buried isolation layer and contacts the single-crystal portion of the semiconductor material, and then converting the polycrystalline layer to a single-crystal layer within the isolation recess; and
   planarizing the semiconductor material and removing a portion of the sidewall insulator, thereby forming an isolated semiconductor layer over the buried isolation layer, wherein the isolated semiconductor layer is separated from the sidewall of the isolation recess by the sidewall insulator.

2. The method of claim 1, comprising removing the sidewall insulator from the isolation recess after forming the isolated semiconductor layer.

3. The method of claim 2, comprising filling a space left by removing the sidewall insulator with a filler dielectric.

4. The method of claim 1, wherein forming the sidewall insulator comprises:
   forming a layer of sidewall material conformally over the top surface of the substrate and extending into the isolation recess; and
   removing the sidewall material from the top surface of the substrate and from the bottom of the isolation recess using an anisotropic etch process so that the sidewall material remains only on the sidewall of the isolation recess to form the sidewall insulator.

5. The method of claim 1, comprising forming a thermal oxide layer at the sidewall and the bottom of the isolation recess prior to forming the sidewall insulator.

6. The method of claim 1, comprising, prior to forming the isolation recess, forming an oxide pad layer using thermal oxidation at the top surface of the substrate and forming a silicon nitride stop layer over the oxide pad layer.

7. The method of claim 1, wherein the top surface of the isolated semiconductor layer is substantially coplanar with the top surface of the substrate adjacent the isolation recess.

8. The method of claim 1, wherein the buried isolation layer does not extend up along an interior lateral surface of the sidewall insulator.

9. The method of claim 1, wherein the buried isolation layer does not extend up along the entire exterior lateral surface of the sidewall insulator.

10. The method of claim 1, wherein forming the buried isolation layer using the thermal oxidation process comprises using one of a dry oxygen process or a steam oxidation process.

11. The method of claim 1, wherein the buried isolation layer of thermal oxide is at least 100 nanometers thick.

12. The method of claim 1, comprising removing the sidewall insulator and then forming a thermal oxide layer on exposed top and sidewall portions of the isolated semiconductor layer.

13. The method of claim 1, wherein the planarizing produces a remaining portion of the single-crystal portion of the semiconductor material that is laterally offset from and coplanar with the isolated semiconductor layer.

14. The method of claim 1, further comprising epitaxially forming the single-crystal portion of the semiconductor material on a top surface of the substrate.

15. The method of claim 1, wherein the single-crystal portion of the semiconductor material acts as a seed crystal during the converting.

16. A method of forming an integrated circuit, comprising:
    forming a dielectric layer on a top surface of a substrate comprising a semiconductor material;
    forming an isolation recess in the substrate;
    forming an epitaxial portion of the semiconductor material on the substrate top surface, the epitaxial portion extending through and above the dielectric layer;
    forming a polycrystalline layer of the semiconductor material that fills the isolation recess and covers the epitaxial portion of the semiconductor material;
    converting the polycrystalline layer to a single-crystal layer that fills the isolation recess; and
    removing a portion of the single-crystal layer thereby electrically isolating the epitaxial portion from the single crystal layer within the isolation recess.

17. The method of claim 16, further comprising oxidizing the semiconductor material at the bottom of the isolation recess prior to forming the polycrystalline layer.

18. The method of claim 16, further comprising, after removing the portion of the single-crystal layer, exposing a sidewall of the single-crystal layer within the isolation trench and forming a thermal oxide on the sidewall and a top surface of the single-crystal layer within the isolation trench.

19. The method of claim 18, further comprising, after forming the thermal oxide, forming a filler dielectric adjacent the thermal oxide on the sidewall.

20. The method of claim 18, wherein removing a portion of the single-crystal layer includes a chemical-mechanical polishing process.

* * * * *